(12) United States Patent
Oh et al.

(10) Patent No.: US 7,002,180 B2
(45) Date of Patent: Feb. 21, 2006

(54) BONDING PAD FOR GALLIUM NITRIDE-BASED LIGHT-EMITTING DEVICE

(75) Inventors: Steve Tchang-Hun Oh, Sharon, MA (US); Hong K. Choi, Sharon, MA (US); Bor-Yeu Tsaur, Lexington, MA (US); John C. C. Fan, Brookline, MA (US)

(73) Assignee: Kopin Corporation, Taunton, MA (US)

( * ) Notice: Subject to any disclaimer, the term of this patent is extended or adjusted under 35 U.S.C. 154(b) by 0 days.

(21) Appl. No.: 10/187,468

(22) Filed: Jun. 28, 2002

(65) Prior Publication Data

US 2004/0000670 A1   Jan. 1, 2004

(51) Int. Cl.
*H01L 27/15* (2006.01)

(52) U.S. Cl. ............................ 257/79; 257/81; 257/94; 257/99

(58) Field of Classification Search ........... 257/79–103
See application file for complete search history.

(56) References Cited

U.S. PATENT DOCUMENTS

| | | | |
|---|---|---|---|
| 4,153,905 A | 5/1979 | Charmakadze et al. |
| 4,495,514 A | 1/1985 | Lawrence et al. |
| 4,625,182 A | 11/1986 | Bovino et al. |
| 4,670,088 A | 6/1987 | Tsaur et al. |
| 4,946,548 A | 8/1990 | Kotaki et al. |
| 4,966,862 A | 10/1990 | Edmond |
| 5,091,333 A | 2/1992 | Fan et al. |
| 5,210,051 A | 5/1993 | Carter, Jr. |
| 5,239,188 A | 8/1993 | Takeuchi et al. |
| 5,247,533 A | 9/1993 | Okazaki et al. |
| 5,252,499 A | 10/1993 | Rothschild |
| 5,272,108 A | 12/1993 | Kozawa |
| 5,278,433 A | 1/1994 | Manabe et al. |
| 5,281,830 A | 1/1994 | Kotaki et al. |
| 5,285,078 A | 2/1994 | Mimura et al. |
| 5,290,393 A | 3/1994 | Nakamura |
| 5,306,662 A | 4/1994 | Nakamura et al. |

(Continued)

FOREIGN PATENT DOCUMENTS

DE    24 21 590 A    11/1975

(Continued)

OTHER PUBLICATIONS

Foresi, J.S. and Moustakas, T.D., "Metal contacts to gallium nitride," *Appl. Phys. Lett.* 62 (22) :2859-2861 (1993).

(Continued)

*Primary Examiner*—Long Pham
*Assistant Examiner*—Wai-Sing Louie
(74) *Attorney, Agent, or Firm*—Hamilton, Brook, Smith & Reynolds, P.C.

(57) ABSTRACT

A bonding pad for an electrode is in contact with p-type gallium nitride-based semiconductor material that includes aluminum. The bonding pad may also includes one or more metals selected from the group consisting of palladium, platinum, nickel and gold. The bonding pad can be used to attach a bonding wire to the p-electrode in a semiconductor device, such as a light-emitting diode or a laser diode without causing degradation of the light-transmission and ohmic properties of the electrode. The bonding pad may be formed of substantially the same material as an electrode in making an ohmic contact with n-type gallium nitride-based semiconductor material (n-electrode). This allows the bonding pad and the n-electrode to be formed simultaneously when manufacturing a gallium nitride-based light-emitting device which substantially reduces the cost to manufacture the device.

12 Claims, 1 Drawing Sheet

U.S. PATENT DOCUMENTS

| | | | |
|---|---|---|---|
| 5,323,022 A | 6/1994 | Glass et al. | |
| 5,334,277 A | 8/1994 | Nakamura | |
| 5,369,289 A | 11/1994 | Tamaki et al. | |
| 5,383,088 A | 1/1995 | Chapple-Sokol et al. | |
| 5,385,862 A | 1/1995 | Moustakas | |
| 5,406,123 A | 4/1995 | Narayan | |
| 5,408,120 A | 4/1995 | Manabe et al. | |
| 5,433,169 A | 7/1995 | Nakamura | |
| 5,442,205 A | 8/1995 | Brasen et al. | |
| 5,455,195 A * | 10/1995 | Ramsey et al. | 438/612 |
| 5,468,678 A | 11/1995 | Nakamura et al. | |
| 5,516,731 A | 5/1996 | Toutounchi et al. | |
| 5,563,422 A | 10/1996 | Nakamura et al. | |
| 5,578,839 A | 11/1996 | Nakamura et al. | |
| 5,637,530 A | 6/1997 | Gaines et al. | |
| 5,652,434 A | 7/1997 | Nakamura et al. | |
| 5,656,832 A | 8/1997 | Ohba et al. | |
| 5,686,738 A | 11/1997 | Moustakas | |
| 5,733,796 A | 3/1998 | Manabe et al. | |
| 5,734,182 A | 3/1998 | Nakamura et al. | |
| 5,747,832 A | 5/1998 | Nakamura et al. | |
| 5,751,752 A | 5/1998 | Shakuda | |
| 5,760,423 A | 6/1998 | Kamakura et al. | |
| 5,767,581 A | 6/1998 | Nakamura et al. | |
| 5,777,350 A | 7/1998 | Nakamura et al. | |
| 5,828,684 A | 10/1998 | Van de Walle | |
| 5,834,326 A | 11/1998 | Miyachi et al. | |
| 5,834,331 A | 11/1998 | Razeghi | |
| 5,850,410 A | 12/1998 | Kuramata | |
| 5,877,558 A * | 3/1999 | Nakamura et al. | 257/749 |
| 5,880,486 A | 3/1999 | Nakamura et al. | |
| 5,900,650 A | 5/1999 | Nitta | |
| 5,905,276 A | 5/1999 | Manabe et al. | |
| 5,959,307 A | 9/1999 | Nakamura et al. | |
| 5,998,925 A | 12/1999 | Shimizu et al. | |
| 6,001,669 A | 12/1999 | Gaines et al. | |
| 6,017,774 A | 1/2000 | Yuasa et al. | |
| 6,051,849 A | 4/2000 | Davis et al. | |
| 6,066,861 A | 5/2000 | Höhn et al. | |
| 6,067,222 A | 5/2000 | Hausmann | |
| 6,069,440 A | 5/2000 | Shimizu et al. | |
| 6,078,063 A | 6/2000 | Nakamura et al. | |
| 6,084,899 A | 7/2000 | Shakuda | |
| 6,093,965 A | 7/2000 | Nakamura et al. | |
| 6,097,040 A | 8/2000 | Morimoto et al. | |
| 6,115,399 A | 9/2000 | Shakuda | |
| 6,118,801 A | 9/2000 | Ishikawa et al. | |
| 6,153,010 A | 11/2000 | Kiyoku et al. | |
| 6,153,894 A | 11/2000 | Udagawa | |
| 6,172,382 B1 | 1/2001 | Nagahama et al. | |
| 6,204,512 B1 | 3/2001 | Nakamura et al. | |
| 6,215,133 B1 | 4/2001 | Nakamura et al. | |
| 6,241,344 B1 | 6/2001 | Machida | |
| 6,245,259 B1 | 6/2001 | Höhn et al. | |
| 6,249,012 B1 | 6/2001 | Manabe et al. | |
| 6,255,129 B1 | 7/2001 | Lin | |
| 6,268,618 B1 | 7/2001 | Miki et al. | |
| 6,287,947 B1 | 9/2001 | Ludowise et al. | |
| 6,337,493 B1 | 1/2002 | Tanizawa et al. | |
| 6,344,665 B1 | 2/2002 | Sung et al. | |
| 6,362,017 B1 | 3/2002 | Manabe et al. | |
| 6,403,987 B1 | 6/2002 | Miki et al. | |
| 6,475,854 B1 | 11/2002 | Narwankar et al. | |
| 6,495,862 B1 | 12/2002 | Okazaki et al. | |
| 6,531,383 B1 * | 3/2003 | Lee | 438/604 |
| 2001/0022367 A1 | 9/2001 | Nakamura et al. | |
| 2001/0028062 A1 | 10/2001 | Uemura et al. | |
| 2001/0030318 A1 | 10/2001 | Nakamura et al. | |
| 2001/0050375 A1 | 12/2001 | Van Dalen | |
| 2002/0001864 A1 | 1/2002 | Ishikawa et al. | |
| 2002/0046693 A1 | 4/2002 | Kiyoku et al. | |
| 2002/0047128 A1 | 4/2002 | Song et al. | |
| 2002/0060326 A1 | 5/2002 | Manabe et al. | |
| 2002/0182765 A1 | 12/2002 | Tran et al. | |
| 2003/0160246 A1 | 8/2003 | Narayan et al. | |
| 2003/0199171 A1 | 10/2003 | Rice et al. | |
| 2003/0222263 A1 | 12/2003 | Choi | |
| 2004/0000671 A1 | 1/2004 | Oh et al. | |
| 2004/0000672 A1 | 1/2004 | Fan et al. | |

FOREIGN PATENT DOCUMENTS

| | | |
|---|---|---|
| DE | 33 45 172 A1 | 7/1985 |
| DE | 199 34 031 A1 | 5/2000 |
| DE | 199 11 717 A1 | 9/2000 |
| DE | 100 60 439 A1 | 6/2002 |
| EP | 0 356 059 A2 | 2/1990 |
| EP | 0 483 688 A2 | 5/1992 |
| EP | 0 483 688 B1 | 5/1992 |
| EP | 0 622 858 A2 | 11/1994 |
| EP | 1 168 460 A2 | 1/2002 |
| JP | 52/028887 | 3/1977 |
| JP | 54-093380 | 7/1979 |
| JP | 59-228776 | 12/1984 |
| JP | 61-056474 | 3/1986 |
| JP | 02-229475 | 9/1990 |
| JP | 2229475 | 9/1990 |
| JP | 03-203388 | 9/1991 |
| JP | 03-218625 | 9/1991 |
| JP | 03-252177 | 11/1991 |
| JP | 04-068579 | 3/1992 |
| JP | 4209577 | 7/1992 |
| JP | 04-242985 | 8/1992 |
| JP | 4236478 | 8/1992 |
| JP | 05-243614 | 9/1993 |
| JP | 06-021511 | 1/1994 |
| JP | 06-177423 | 6/1994 |
| JP | 06-268259 | 9/1994 |
| JP | 8167735 | 6/1996 |
| JP | 8213692 | 8/1996 |
| JP | 8306643 | 11/1996 |
| JP | 8306958 | 11/1996 |
| JP | 8316527 | 11/1996 |
| JP | 9092880 | 4/1997 |
| JP | 9134881 | 5/1997 |
| JP | 9167857 | 6/1997 |
| JP | 11145513 | 5/1999 |
| JP | 2001015811 | 1/2001 |
| WO | WO 88/00392 | 1/1988 |
| WO | WO 01/47038 A1 | 6/2001 |
| WO | WO 200173858 A1 | 10/2001 |
| WO | WO 02/09185 A1 | 1/2002 |

OTHER PUBLICATIONS

Nakamura, S., "InGaN blue—light—emitting diodes," *Journal of the Institute of Electronics, Information and Communication Engineers* 76 (9) :913-917 (1993) (Abstract).

Akasaki, I. and Amano, H., "High efficiency UV and blue emitting devices preared by MOVPE and low energy electron beam irradiation treatment," *Physical Concepts of Materials for Novel Optoelectronic Device Applications, 1361*:138-149 (1990).

Amano, H., et al., "P-Type Conduction in Mg-Doped GaN Treated with Low-Energy Electron Beam Irradiation (LEEBI)", *Japanese Journal of Applied Physics* 28(12) : L2112-L2114 (1989).

Andreev, V.M., et al., "Luminescence Properties of i-n,i-n-i and n-i-n Structures Made of Epitaxial Layers GaN/α-$Al_2O_3$," *Journal of Luminescence* 35:9-16 (1986).

Boulou, M., et al., "Recombination Mechanisms in GaN:Zn," *Journal of Luminescence* 18/19:767-770 (1979).

Casey, Jr., H.C. and Panish, M.B., "SLAB-Dielectric Waveguides," in *Heterostructure Lasers*, (NY: Academic Press), pp. 32-35 (1978).

Foresi, J.S. and Moustakas, T.D., "Metal Contacts to gallium nitride," *Appl. Phys. Lett. 62*(22) :2859-2861 (1993).

Goldenberg, B., et al., "Ultraviolet and violet light-emitting GaN diodes grown by low-pressure metalorganic chemical vapor deposition," *Appl. Phys. Lett. 62*(4) :381-383 (1993).

F. Goodenough, "Exotic Semiconductors Showcased at the IEDM," *Electronic Design*, pp. 60, 62, 64-66, 68 (1994).

Hayashi, I., et al., "Junction Lasers Which Operate Continuously at Room Temperature," *Appl. Phys. Lett. 17*(3) :109-111 (1970).

Jacob, G., et al., "GaN Electroluminescent Devices: Preparation and Studies," *Journal of Luminescence 17*:263-282 (1978).

Jang, J.-S., et al., "High Quality Non-Alloyed Pt Ohmic Contacts to P-Type GaN Using Two-Step Surface Treatment," *MRS Internet J. Nitride Semiconductor Res. F99W10.4* .

Kaminska, E., et al., "Ni/Si-Based Contacts to GaN: Thermally Activated Structural Transformations Leading to Ohmic Behavior," *MRS Internet J. Nitride Semicond. Res. 4S1, G9.9*.

Kampen, T.U. and Mönch, W., "Metal Contacts on a-GaN," *MRS Internet J. Nitride Semicond. Res.* 1(41).

Madar, R., "High Pressure Solution Growth of GaN$^+$," *Journal of Crystal Growth 31*: 197-203 (1975).

Matsuoka, T., "Growth and Properties of a Wide-Gap Semiconductor InGaN," *Optoelectronics 5*(1) :53-64 (1990).

T. Matsuoka, "Current status of GaN and related compounds as wide-gap semiconductors," *Journal of Crystal Growth 124*:433-438 (1992).

Nakamura, S., et al., "High-power InGaN/GaN double-heterostructure violet light emitting diodes," *Appl. Phys. Lett. 62*(19) :2390-2392 (1993).

Nakamura, S., et al., "P-GaN/N-InGaN/N-GaN Double-Heterostructure Blue-Light-Emitting Diodes," *Jpn. J. Appl. Phys. 32*:L8-L11 (1993).

S. Nakamura, "Growth of $In_xGa_{(1-x)}N$ compound semiconductors and high-power InGaN/AlGaN double heterostructure violet-light-emitting diodes," *Microelectronics Journal 25*:651-659 (1994).

Nakamura, S., et al., "High-Power GaN P-N Junction Blue-Light-Emitting Diodes," *Japanese Journal of Applied Physics 30*(12A) : L1998-:L2001 (1991).

S. Nakamura, "InGaN/AlGaN Double-Heterostructure Blue LEDs," *Mat. Res. Soc. Symp. Proc.*vol. 339:173-178 (1994).

Nakamura, S., et al., "Thermal Annealing Effects on P-Type Mg-Doped GaN Films," *Jpn. J. Appl. Phys. 31*:L139-L142 (1992).

S. Nakamura, "Zn-doped InGaN growth and InGaN/AlGaN double-heterostructure blue-light-emitting diodes," *Journal of Crystal Growth 145*:911-917 (1994).

Nakamura, S., et al., "High-brightness InGaN/AlGaN double-heterostructure blue-green-light-emitting diodes," *J. Appl. Phys. 76*(12) :8189-8191 (1994).

Nakamura, S., et al., "Cd-Doped InGaN Films Grown on GaN Films," *Jpn. J. Appl. Phys. 32*:L338-L341 (1993).

S. Nakamura, "High-Power InGaN/AlGaN Double-Heterostructure Blue-Light-Emitting Diodes," Int'l Electronic Devices Meeting 94:567-570 (1994).

Piotrowska, A., et al., "Ohmic Contacts to III-V Compound Semiconductors: A Review of Fabrication Techniques," *Solid-State Electronics 26*(3) : 179-197 (1983).

Sporken, R., et al., "XPS study of Au/GaN and Pt/GaN contacts," *MRS Internet J. Nitride Semiconductor Res. 2*(23) (1997).

Venugopalan, H.S., et al., "Phase Formation and Morphology in Nickel and Nickel/Gold Contacts To Gallium Nitride," MRS Internet Journal Nitride Semiconductor Research (1997) <URL:http://nsr.mij.mrs.org/MRS/S97-D/4.10>.

Zhou, L., et al., "Characteristics of Ti/Pt/Au Ohmic Contacts on p-type $GaN/Al_xGa_{1-x}N$ Superlattices," *MRS Internet J. Nitride Semicond. Res. F99W10.3*.

Dovidenko, K., et al., "Aluminum nitride films on different orientations of sapphire and silicon," *J. Appl. Phys. 79*(5) : 2439-2445, (1996).

Jain, S.C., et al., "Applied Physics Reviews/III—nitrides: Growth, characterization, and properties," *J. Appl. Phys. 87*(3) : 965-1006, (2000).

Lin, Y.S. et al., "Dependence of composition fluctuation on indium content in InGaN/GaN multiple quantum wells," *Appl. Phys. Lett.*, 77(19) : 2988-2990, (2000).

Narukawa, Y., et al., "Dimensionality of excitons in laser-diode structures composed of $In_xGa_{1-x}N$ multiple quantum wells," *Phys. Rev. B, 59*(15) : 10283-10288, (1999).

Kawakami, Y., et al., "Dynamics of optical gain in $In_xGa_{1-x}$ N multi-quantum well-based laser diodes,"*Appl. Phys. Lett.*, 77(14) : 2151-2153, (2000).

Strite, S., and Morkoc, H., "GaN, AlN, anf InN: A review," *J. Vac. Sci. Technol. B, 10*(4) :1237-1266, (1992).

Hassan, K.M., et al., "Optical and structural studies of Ge nanocrystals embedded in AlN matrix fabricated by pulsed laser deposition," *Appl. Phys. Lett.*, 75(9) : 1222-1224, (1999).

Teng, C.W., et al., "Quantum confinement of $E_1$ and $E_2$ transitions in Ge quantum dots embedded in an $Al_2O_3$ or an AlN matrix," *Appl. Phys. Lett.*, 76(1) : 43-45, (2000).

Narukawa, Y., et al., "Role of self-formed InGaN quantum dots for exciton localization in the purple laser diode emitting at 420 nm," *Appl. Phys. Lett.*, 70(8) : 981-983, (1997).

Nakamura, S., et al., "The Roles of Structural Imperfections in InGaN-Based Blue Light-Emitting Diodes and Laser Diodes," *Science Magazine*, 1-14, [retrieved online Aug. 8, 2000]. Retrieved from the Internet <URL:http://www.science.org/cgi/content/full/281/5379/956>.

Chichibu, S., et al., "Spatially resolved cathodoluminescence spectra of InGaN quantum wells," *Appl. Phys. Lett.*, 71(16) : 2346-2348, (1997).

Kim, H., et al., "Design and Fabrication of Highly Efficient GaN-Based-Light-Emitting Diodes," IEEE Transactions on Electron Devices, 49(10):1715-1722 (2002).

Maeda, T., et al., "Effects of NiO on electrical properties of NiAu-based ohmic contacts for p-type GaN," Applied Physics Letters, 75(26):4145-4147 (1999).

* cited by examiner

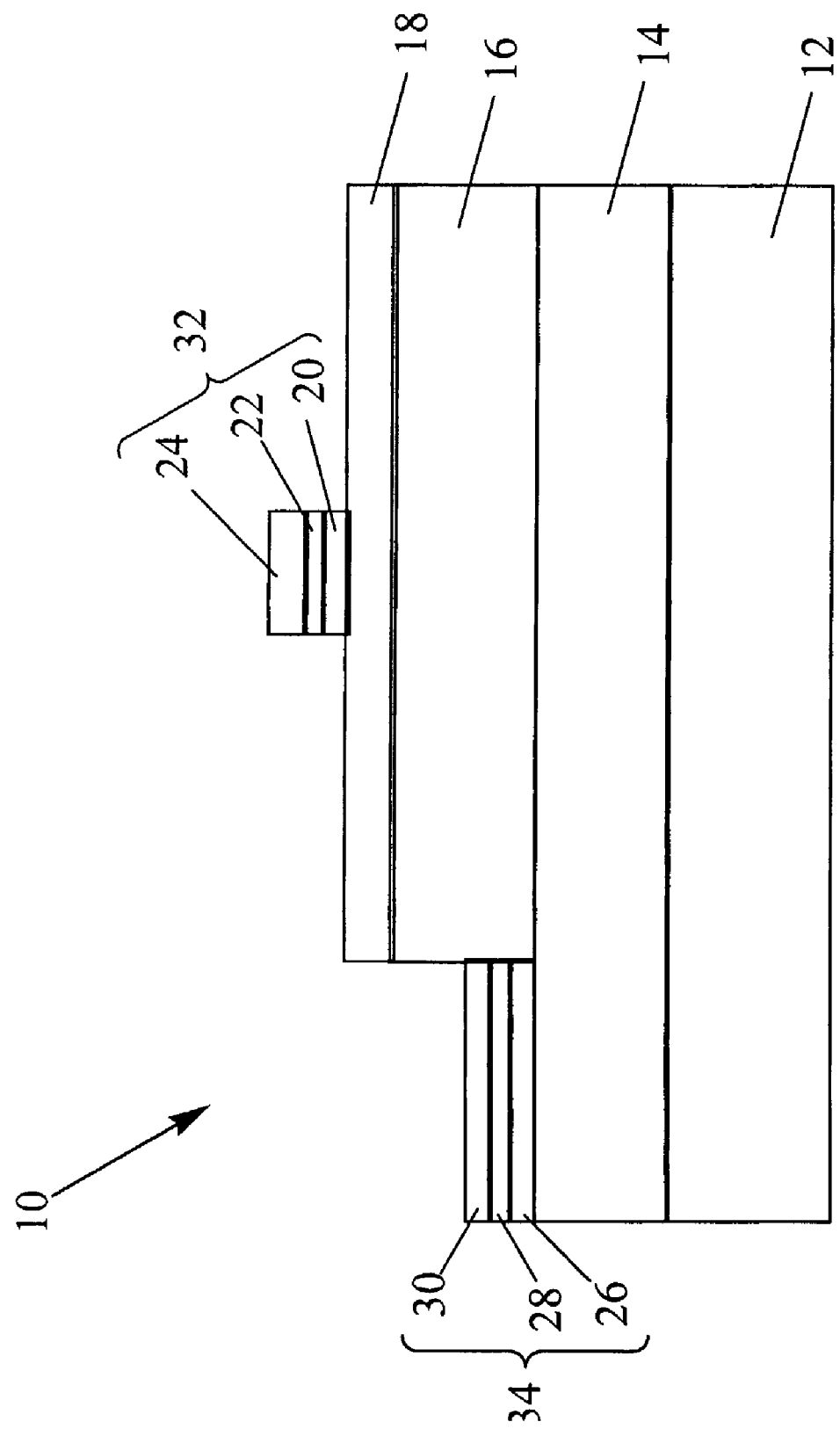

BONDING PAD FOR GALLIUM NITRIDE-BASED LIGHT-EMITTING DEVICE

INCORPORATION BY REFERENCE

The entire teachings of the following applications are incorporated herein by reference: Attorney Docket Number 0717.2029-000, "High-Power Light-Emitting Diode Structures," by John C. C. Fan, Hong K. Choi, and Steve Tchang-Hun Oh, filed on even date herewith; Attorney Docket Number 0717.2030-000, "Electrode for p-Type Gallium Nitride-Based Semiconductor," by Tchang-Hun Oh, Hong K. Choi, Bor-Yeu Tsaur, John C. C. Fan, Shirong Liao, and Jagdish Narayan, filed on even date herewith; Attorney Docket Number 0717.2032-000, "Light-Emitting Diode Device Geometry," by John C. C. Fan, Hong K. Choi, Steven Oh, J. C. Chen, and Jagdish Narayan, filed on Jun. 17, 2002; and Attorney Docket Number 0717.2033-000, "Domain Epitaxy for Thin Film Growth," by Jagdish Narayan, filed on even date herewith.

BACKGROUND OF THE INVENTION

Recently, much attention has been focused on GaN-based compound semiconductors (e.g., $In_xAl_yGa_{1-x-y}N$, wherein $x+y \leq 1$, $0 \leq x \leq 1$, and $0 \leq y \leq 1$) for blue, green, and ultraviolet light emitting diode (LED) applications. One important reason is that GaN-based LEDs have been found to exhibit efficient light emission at room temperature.

In general, GaN-based LEDs comprise a multilayer structure in which n-type and p-type GaN-based semiconductor layers are stacked on a substrate (most commonly on a sapphire substrate with the n-type GaN-based semiconductor layer in contact with the substrate), and $In_xGa_{1-x}N/GaN$ multiple quantum well layers are sandwiched between the p-type and n-type GaN layers. A number of methods for growing the multilayer structure are known in the art, including metalorganic chemical vapor deposition (MOCVD), molecular beam epitaxy (MBE) and hydride vapor phase epitaxy (HVPE).

In general, p-type GaN-based semiconductor layers formed by growth methods, such as MOCVD, behave like a semi-insulating or high-resistive material. This is thought to result from hydrogen passivation caused by hydrogen that is present in the reaction chamber complexing with the p-type dopant and thus preventing the dopant from behaving as an active carrier. Typically, p-type GaN-based semiconductor materials are thermally annealed to activate the p-type carriers. However, even after thermal annealing, the resistivity of p-type GaN-based semiconductor materials remains relatively high.

Since p-type GaN-based semiconductor layers have only moderate conductivity, a p-electrode typically is formed to cover substantially the entire surface of the p-type GaN-based semiconductor layer in a GaN-based light-emitting device in order to ensure uniform application of current to the entire layer and obtaining uniform light emission from the light-emitting device. However, this geometry requires that the p-electrode be light-transmissive so that light emitted by the light-emitting device can be observed through the p-electrode. Typically, the p-electrode layer must be very thin in order to be light transmissive and thus, it is difficult to attach a bonding wire directly to it. Therefore, a bonding pad is used to attach the bonding wire to the p-electrode. However, metallic materials used in the bonding pad can migrate into the p-electrode causing degradation of the light-transmission and ohmic property of the electrode. In the past, this problem has been particularly encountered when the bonding pad includes aluminum.

SUMMARY OF THE INVENTION

The invention is a bonding pad for an electrode in contact with p-type gallium nitride-based semiconductor material that includes aluminum. In one embodiment, the bonding pad also includes one or more metals selected from the group consisting of palladium, platinum, nickel and gold. In a preferred embodiment, the bonding pad includes aluminum, palladium and gold.

The bonding pad of the invention can be used to attach a bonding wire to the p-electrode in a semiconductor device, such as a light-emitting diode (LED) or a laser diode (LD). A semiconductor device utilizing the bonding pads of the invention includes a substrate having a first major surface. Over the first major surface of the substrate is a semiconductor device structure that includes an n-type gallium nitride-based semiconductor layer, and a p-type gallium nitride-based semiconductor layer over the n-type semiconductor layer. A first electrode is in electrical contact with the n-type semiconductor layer, and a second electrode is in contact with the p-type semiconductor layer. A bonding pad containing a metallic material that includes aluminum is in contact with the second electrode. In one embodiment, the bonding pad additionally includes palladium. For example, the bonding pad may have a layer of palladium in contact with the second electrode and a layer of aluminum over the palladium layer. In another embodiment, the bonding pad may be a three-layer metallic material. For example, the bonding pad may have a layer of palladium in contact with the second electrode and a layer of aluminum and a layer of gold over the palladium layer. In this example, the layer of aluminum may be between the layer of palladium and the layer of gold, or the layer of gold may be between the layer of palladium and the layer of aluminum. In another embodiment, the first electrode and the bonding pad are of substantially the same material. The phrase, "substantially the same material," as used herein means that the same metallic elements are used to make the bonding pad and the first electrode, but the metallic elements are not necessarily present in the bonding pad and in the first electrode in the same amounts. For example, both the bonding pad and the first electrode may be made of palladium, aluminum and gold, but the bonding pad may contain less aluminum and more palladium and/or gold than the first electrode.

To prepare a semiconductor device utilizing the bonding pad of the invention, a substrate having a first major surface is provided, and a semiconductor device structure is provided over the first major surface of the substrate. The semiconductor device structure includes an n-type gallium nitride-based semiconductor layer and a p-type gallium nitride-based semiconductor layer over the n-type semiconductor layer. A first electrode is provided that is in electrical contact with the n-type gallium nitride-based semiconductor layer, and a second electrode is provided that is in contact with the p-type semiconductor layer. A bonding pad containing a metallic material that includes aluminum is formed such that it is in contact with the second electrode. In one embodiment, the bonding pad is formed by forming a layer of palladium in contact with the second electrode and forming a layer of aluminum over the palladium. In another embodiment, the bonding pad is formed by forming a layer of palladium in contact with the second electrode, forming a layer of aluminum over the palladium, and forming a layer of gold over the layer of aluminum. In another embodiment, the bonding pad and the first electrode are formed from substantially the same metallic material. In this embodiment, the bonding pad and the first electrode may be formed simultaneously. For example, a first layer of palladium is formed in contact with the n-type gallium nitride-based semiconductor layer while simultaneously forming a first layer of palladium in contact with the second electrode (i.e., the p-electrode). A layer of aluminum is then simultaneously formed over the layer of palladium in contact with n-type gallium nitride-based semiconductor layer and the layer of palladium in contact with the second electrode, thereby simultaneously forming the first electrode and the bonding pad. In a preferred embodiment, a layer of gold is simultaneously formed over the first electrode and the bonding. More preferably, after deposition of the metallic layers forming the first electrode and the bonding pad, the first electrode and the bonding pad are simultaneously annealed.

Bonding pads formed by the method of the invention adhere satisfactorily to the bonding wire and do not degrade the light transmission or ohmic property of the p-electrode. In addition, the metallic materials used to form the bonding pads of the invention can also be used to form an electrode that forms a good ohmic contact with an n-type gallium nitride-based semiconductor layer. Thus, when manufacturing gallium nitride-based devices, the bonding pad for the p-electrode can be formed simultaneously with the n-electrode, substantially reducing the cost to manufacture of the device.

BRIEF DESCRIPTION OF THE DRAWINGS

The FIGURE is an example of a light-emitting diode having a bonding pad of the invention.

DETAILED DESCRIPTION OF THE INVENTION

As used herein, a gallium nitride-based semiconductor material is a material having the formula $In_xAl_yGa_{1-x-y}N$, wherein $x+y \leq 1$, $0 \leq x \leq 1$, and $0 \leq y \leq 1$. Gallium nitride-based semiconductor material are usually grown by a vapor phase growth method such as metalorganic chemical vapor deposition (MOCVD or MOVPE), hydride chemical vapor deposition (HDCVD), or molecular beam epitaxy (MBE). Generally, a gallium nitride-based semiconductor material is an n-type material even when no n-type dopant is included in the material since nitrogen lattice vacancies are created during crystal growth. Thus, an n-type gallium nitride-based semiconductor material may not include an n-type dopant. However, an n-type gallium nitride-based semiconductor typically exhibits better conductivity when the material includes an n-type dopant. n-Type dopants for gallium nitride-based semiconductor materials include Group IV elements such as silicon, germanium and tin, and Group VI elements such as selenium, tellurium and sulfur.

A p-type gallium nitride-based semiconductor material is a gallium nitride-based semiconductor material that includes a p-type dopant. The p-type dopants (also called an acceptor) for gallium nitride-based semiconductor materials include Group II elements such as cadmium, zinc, beryllium, magnesium, calcium, strontium, and barium. Preferred p-type dopants are magnesium and zinc. Typically, during growth of the gallium nitride-based semiconductor material gaseous compounds containing hydrogen atoms are thermally decomposed to form the semiconductor material. The released hydrogen atoms, which are present mainly as protons, become trapped in the growing semiconductor material, and combine with p-type dopant inhibiting their acceptor function. To improve the conductivity of a p-type gallium nitride-based semiconductor material, the material may be placed in a high electric field, typically above 10,000 volts/cm for about 10 minutes or more. The protons trapped in the semiconductor material are drawn out of the material to the negative electrode, thereby activating the function of the p-type dopants (see, for example, U.S. patent application Ser. No. 10/127,345, the entire teachings of which are incorporated herein by reference). Alternatively, the conductivity of the p-type gallium nitride-based semiconductor material can be improved by annealing the material at a temperature above 600° C. in a nitrogen environment for 10 minutes or more (see, for example, U.S. Pat. No. 5,306,662, the entire teachings of which are incorporated herein by reference).

As described above, a gallium nitride-based semiconductor structure includes a p-type gallium nitride-based semiconductor layer and n-type gallium nitride-based semiconductor layer. The p-type gallium nitride-based semiconductor layer is generally grown over the n-type gallium nitride-based semiconductor layer. The n-type and p-type semiconductor layers can be in direct contact with each other or, alternatively, an active region can be sandwiched between the n-type and p-type gallium nitride-based semiconductor layers. An active region can have a single quantum-well structure or a multiple quantum-well structure. An active region having a single quantum-well structure has a single layer (i.e., the well layer) formed of a gallium nitride-based semiconductor material having a lower band-gap than the n-type and p-type gallium nitride-based semiconductor layers sandwiching it. An active region having a multiple quantum-well structure includes multiple well layers alternately stacked with multiple layers that have a higher band-gap than the well layers (i.e., barrier layers). The outer most layer of the active region closest to the n-type gallium nitride-based semiconductor layer is a well layer and has a smaller band-gap than the n-type gallium nitride-based semiconductor layer. The outer most layer of the active region closest to the p-type gallium nitride-based semiconductor layer may be a well layer or a barrier layer and may have a band-gap that is larger or smaller than the p-type gallium nitride-based semiconductor layer. Typically, the thickness of a well layer in a quantum-well structure is about 70 Å or less, and the barrier layers are about 150 Å or less. Generally, the well layers and barrier layers in a quantum-well structure are not intentionally doped.

The phrase "substantially light transmissive," as used herein, with respect to an electrode means that the electrode transmits at least 1% of the light emitted from the gallium nitride-based semiconductor device therethrough. A light-transmitting electrode typically transmits about 20% to about 40% of the light emitted from the gallium nitride-based semiconductor device.

The phrase "ohmic contact," as used herein, refers to a region where two materials are in contact, which has the property that the current flowing through the region is proportional to the potential difference across the region.

The bonding pad of the invention are formed by depositing metal layers on a p-electrode via sputtering, vacuum resistive heating, vacuum electron-beam or other deposition techniques known to those skilled in the art. Typically, a first metallic layer of palladium, platinum, nickel or combinations thereof is deposited on the p-electrode. The first metallic layer has a thickness in the range of between about 20 Å and about 1000 Å. Preferably, the thickness of the first layer is in the range of between about 50 Å and 150 Å. A layer of aluminum having a thickness in the range of between about 10 Å and about 1000 Å is deposited on the first layer. Preferably, the thickness of the aluminum layer is in the range of between about 30 Å and about 150 Å. A layer of gold having a thickness in the range of between about 100 Å and about 10,000 Å is deposited on the aluminum layer. Preferably, the thickness of the gold layer is in a range of between about 3,000 Å and about 6,000 Å.

After deposition of the metallic layers of the bonding pad, the bonding pad is optionally annealed by heating the bonding pad to a temperature in the range of between about 350° C. and about 550° C. for about 30 seconds to about 1 hour. A preferred annealing temperature range is between about 400° C. and about 500° C. Annealing can be accomplished using a furnace, rapid thermal annealing or a hot plate. In some instances, it is desirable to anneal p-electrodes. For example, when the metallic layers deposited to form the p-electrode contain nickel, the nickel can be oxidized to nickel oxide, which forms a better ohmic contact than nickel, by annealing the p-electrode in an atmosphere that contains at least about 1% oxygen (see Attorney Docket Number 0717.2030-000, "Electrode for p-Type Gallium Nitride-Based Semiconductors," filed on Jun. 28, 2002, the entire teachings of which are incorporated herein by reference.) When it is desirable to anneal the p-electrode, the p-electrode and the bonding pad may be annealed simultaneously.

In a preferred embodiment, the n-electrode in contact with the n-type gallium nitride-based semiconductor layer of a semiconductor device is composed of substantially the same material as the bonding pad. In this embodiment, the metallic layers of the n-electrode may be deposited in the order described above for the bonding pads. Typically, the metallic layers of the n-electrode have thicknesses in the ranges described for each of the metallic layers of the bonding pad. However, although the thickness of the layer of aluminum for the bonding pad and the layer of aluminum for the n-electrode are both in the range of between about 10 Å and about 1000 Å, in a preferred embodiment the layer of aluminum in the n-electrode is thicker than the layer of aluminum in the bonding pad.

The FIGURE shows gallium nitride-based light-emitting diode 10 having n-electrode 34 and bonding pad 32 for p-electrode 18. As discussed above, n-electrode 34 and bonding pad 32 may be formed of substantially the same material and can be formed separately or simultaneously. n-Type gallium nitride-based semiconductor layer 14 is formed on substrate 12. p-Type gallium nitride-based layer 16 is formed over the n-type gallium nitride-based layer. When the n-electrode and the bonding pad are form of substantially the same material, layer 20 may be composed of the same material as layer 26, layer 22 may be composed of the same material as layer 28, and layer 24 may be composed of the same material as layer 30. However, layer 20 need not be the same thickness as layer 26, layer 22 need not be the same thickness as layer 28, and layer 24 need not be the same thickness as layer 30. In a preferred embodiment, layers 20 and 26 are composed of palladium, platinum, nickel or combinations thereof, layers 22 and 28 are composed of aluminum, and layers 24 and 30 are composed of gold.

It is preferable to anneal the n-electrode by heating the n-electrode to a temperature in the range of between about 350° C. and about 550° C. for about 30 seconds to about 1 hour. A preferred annealing temperature range is between about 400° C. and about 500° C. The bonding pad and the n-electrode are preferably annealed simultaneously.

EXAMPLE 1

A bonding pad was prepared by depositing a 100 Å thick layer of palladium on a p-type electrode. A 100 Å thick layer of aluminum was deposited on the palladium layer, then a 5000 Å thick gold layer was deposited on the aluminum layer. The metal layers were annealed at a temperature of 470° C. in a furnace in an environment that containing 65% oxygen and 35% nitrogen for 30 min.

EXAMPLE 2

A bonding pad was prepared by depositing a 200 Å thick layer of palladium on a p-type electrode. A 100 Å thick layer of aluminum was deposited on the palladium layer, then a 5000 Å thick gold layer was deposited on the aluminum layer. The metal layers were annealed at a temperature of 450° C. in a rapid thermal annealing apparatus in an environment that containing 100% nitrogen for 10 min.

The bonding pads formed in either of the methods described in Example 1 or 2 do not substantially change the light transmission of the p-electrode. In addition, the p-electrode retain formed a good ohmic contact after addition of the bonding pad.

EQUIVALENTS

While this invention has been particularly shown and described with references to preferred embodiments thereof, it will be understood by those skilled in the art that various changes in form and details may be made therein without departing from the scope of the invention encompassed by the appended claims.

What is claimed is:

1. A semiconductor device comprising:
   a substrate having a first major surface;
   a semiconductor device structure over the first major surface of the substrate, the device structure comprising an n-type gallium nitride-based semiconductor layer, and a p-type gallium nitride-based semiconductor layer over the n-type semiconductor layer;
   a first electrode in electrical contact with the n-type semiconductor layer;
   a second electrode in contact with the p-type semiconductor layer; and
   a bonding pad in contact with the second electrode, the bonding pad comprising a metallic material that include a first metal layer of a metal selected from the group consisting of palladium, platinum, nickel and combinations thereof in contact with the second electrode, and a layer of aluminum over the first metal layer.

2. The device of claim 1, wherein the metallic material of the bonding pad additionally comprises palladium.

3. The device of claim 1, wherein metallic material of the bonding pad additionally comprises gold.

4. The device of claim 1, wherein the bonding pad comprises a three layer metallic material, including a layer of palladium in contact with the second electrode, and a layer each of aluminum and gold over the palladium.

5. The device of claim 1, wherein the second electrode is substantially light transmissive.

6. The device of claim 1, wherein the first electrode and the bonding pad comprise substantially the same metallic material.

7. The device of claim 1, further comprising an active region of a semiconductor material between the n-type semiconductor layer and the p-type semiconductor layer.

8. The device of claim 7, wherein the active region has a single quantum-well structure.

9. The device of claim 7, wherein the active region has a multiple quantum-well structure.

10. A semiconductor device comprising:
   a substrate having a first major surface;
   a semiconductor device structure over the first major surface of the substrate, the device structure comprising an n-type gallium nitride-based semiconductor layer, and a p-type gallium nitride-based semiconductor layer over the n-type semiconductor layer;
   a first electrode in electrical contact with the n-type semiconductor layer;
   a second electrode in contact with the p-type semiconductor layer; and
   a bonding pad in contact with the second electrode, wherein the first electrode and the bonding pad are formed of substantially the same metallic material that includes aluminum and wherein the metallic material includes a first metal layer of a metal selected from the group consisting of palladium, platinum, nickel and combinations thereof in contact with the second electrode, and a layer of aluminum over the first metal layer.

11. The device of claim 10, wherein the first electrode and the bonding pad each additionally comprise gold.

12. A gallium nitride-based semiconductor device comprising:
   a first electrode in electrical contact with the n-type gallium nitride-based semiconductor layer;
   a second electrode in contact with the p-type gallium nitride-based semiconductor layer; and
   a bonding pad in contact with the second electrode, the bonding pad comprising a metallic material that include a first metal layer of a metal selected from the group consisting of palladium, platinum, nickel and combinations thereof in contact with the second electrode, and a layer of aluminum over the first metal layer.

* * * * *